United States Patent [19]
Carlberg

[11] Patent Number: 5,781,039
[45] Date of Patent: Jul. 14, 1998

[54] FREQUENCY CONTROLLED SWITCH

[75] Inventor: Stefan Carlberg, Kungsängen, Sweden

[73] Assignee: Telefonaktiebolaget LM Ericsson, Stockholm, Sweden

[21] Appl. No.: 567,804

[22] Filed: Dec. 6, 1995

Related U.S. Application Data

[63] Continuation of Ser. No. 153,081, Nov. 17, 1993, abandoned.

[30] Foreign Application Priority Data

Nov. 18, 1992 [SE] Sweden .................. 9203469

[51] Int. Cl.$^6$ .............. H03K 9/06; H03K 17/00
[52] U.S. Cl. .............. 327/44; 327/399; 327/427
[58] Field of Search .................. 307/522, 523, 307/571, 362; 328/138, 140; 327/44, 45, 47, 427, 77, 39, 40, 392, 398, 399

[56] References Cited

U.S. PATENT DOCUMENTS

| | | | |
|---|---|---|---|
| 3,398,366 | 8/1968 | Apfelbeck | 328/138 |
| 3,462,614 | 8/1969 | Barlow, Jr. | 307/522 |
| 3,582,974 | 6/1971 | Favin et al. | 307/235 |
| 3,584,275 | 6/1971 | Paulson | 317/147 |
| 3,584,298 | 6/1971 | Kolbiaz | 324/78 |
| 3,593,171 | 7/1971 | Gassmann | 329/102 |
| 3,811,052 | 5/1974 | Billing | 307/233 |
| 3,852,616 | 12/1974 | Carp et al. | 307/233 |
| 3,914,619 | 10/1975 | Talmage et al. | 307/129 |
| 4,081,694 | 3/1978 | Abdoo | 307/129 |
| 4,146,846 | 3/1979 | Thomas et al. | 330/293 |
| 4,366,391 | 12/1982 | Brightwell | 307/129 |
| 4,629,915 | 12/1986 | Suzuki et al. | 307/522 |
| 5,191,235 | 3/1993 | Hara | 307/362 |
| 5,327,099 | 7/1994 | Fergus | 327/334 |
| 5,382,838 | 1/1995 | Sasaki et al. | 327/333 |

FOREIGN PATENT DOCUMENTS

| | | |
|---|---|---|
| 131 781 | 1/1985 | European Pat. Off. . |
| 22 27 724 | 12/1972 | Germany . |
| 464 598 | 5/1991 | Sweden . |
| 1 393 457 | 5/1975 | United Kingdom . |
| 2 188 500 | 9/1987 | United Kingdom . |

Primary Examiner—Timothy P. Callahan
Assistant Examiner—Eunja Shin
Attorney, Agent, or Firm—Burns, Doane, Swecker & Mathis, L.L.P.

[57] ABSTRACT

A method and an apparatus in testing whether the frequency of an incoming signal is higher or lower than a predetermined value. The method only demands a capacitor (C), a resistor (R), a field effect transistor (Q) and a constant current generator (I). Because the included capacitor only needs to have a small value, a circuit design according to the method is very suitable for integration, for example, in form of a monolithic integrated circuit for frequency control in connection to DC/DC converters.

5 Claims, 1 Drawing Sheet

FREQUENCY CONTROLLED SWITCH

This application is a continuation of application Ser. No. 08/153,081, filed Nov. 17, 1993, now abandoned.

The present invention relates to a method and an electronic device to detect whether or not an incoming signal does have a predetermined frequency and more exactly in form of a method for a frequency control having a simple integrated circuit configuration and as a portion of a control circuit of a DC/DC converter.

BACKGROUND ART

Sometimes there is a need to be able to detect whether a signal has a frequency higher or lower than a desired value and dependent of the frequency of this signal control a switch, which preferably is of an electronic type. Such needs arise in DC/DC converters where it is necessary to decide whether or not a pulse width modulated signal is having a desired frequency. If the pulse width modulated control signal is not having the correct frequency the converter switches to another steering function.

Prior art for solving this technical problem normally utilizes so called RC networks, i.e., a network consisting of resistors and capacitors, to obtain some certain determined time constant, to be able to detect the frequency. In addition, different types of electronic logic circuitry are additionally added for the final detection of the frequency. These solutions therefore generally comprise a larger number of components in the form of capacitors and resistors and therefore generally will demand lot of surface and consequently will be of less interest for integration on a silicon chip.

U.S. Pat. No. 4,629,915 discloses a frequency discrimination circuit, which comprises a monostable circuit to which an input signal is fed and a D-type flip-flop is connected to the output side of the monostable circuit. The circuit further includes a time constant modifying circuit for modifying a time constant of the monostable circuit according to the frequency discriminated signal from the D-type flip-flop.

U.S. Pat. No. 3,584,275 discloses a frequency responsive switch circuit having a degenerative feedback network for suppressing all input signals having frequencies other than the preselected frequency. The circuit solution utilizes a large number of discrete components. In a similar manner, U.S. Pat. No. 3,914,619 discloses a frequency sensitive switch particularly suited for use with an apparatus for limiting the position of the throttle of an combustion engine. In addition, U.S. Pat. No. 4,366,391 discloses a fuel burner control system, for sensing when input pulses are having a repetition rate within a predetermined range.

U.S. Pat. No. 4,081,694 discloses a circuit for detection of the presence of a predetermined input frequency, while U.S. Pat. No. 3,811,052 discloses an electric frequency indicating means for use with an AC generator.

A German document DE-2 227 724 discloses a device for comparison of a signal period with one having a predetermined duration obtained from time base generator, to compare a frequency with a determined frequency threshold.

Finally, a Swedish document SE 464 598 discloses a controllable switch dependent of a sequence of pulses, primarily intended for limiting ignition pulses of a motor.

Common to all documents above cited is that they in one way or another are using some type of RC network to be compared to the frequency being controlled. Additionally these devices rely on a great number of necessary components for the function of the circuits.

SUMMARY OF THE DISCLOSURE

Therefore there is an object of the present invention to provide a method and a circuit design for detecting whether or not an incoming signal is having a desired frequency, and which circuit design is well suited for integration.

There is an additional object according to the present invention to provide a method relying on a new sensing principle in that the average value of the channel resistance in a field effect transistor is permitted to vary with the input frequency.

Another additional object according to the present invention is to provide a circuit for detecting whether or not an incoming signal is having a desired frequency in that the incoming signal of the circuit according to the new sensing principle will vary the average channel resistance of a field effect transistor.

An additional object of the present invention is to provide a frequency control intended to be included in a DC/DC converter in form of an integrated monolithic circuit using the new sensing principle.

BRIEF DESCRIPTION OF THE DRAWINGS

The invention will be described in form of an illustrative embodiment by means of the attached drawings in which.

DETAILED DESCRIPTION OF THE DISCLOSURE

Figure 1:
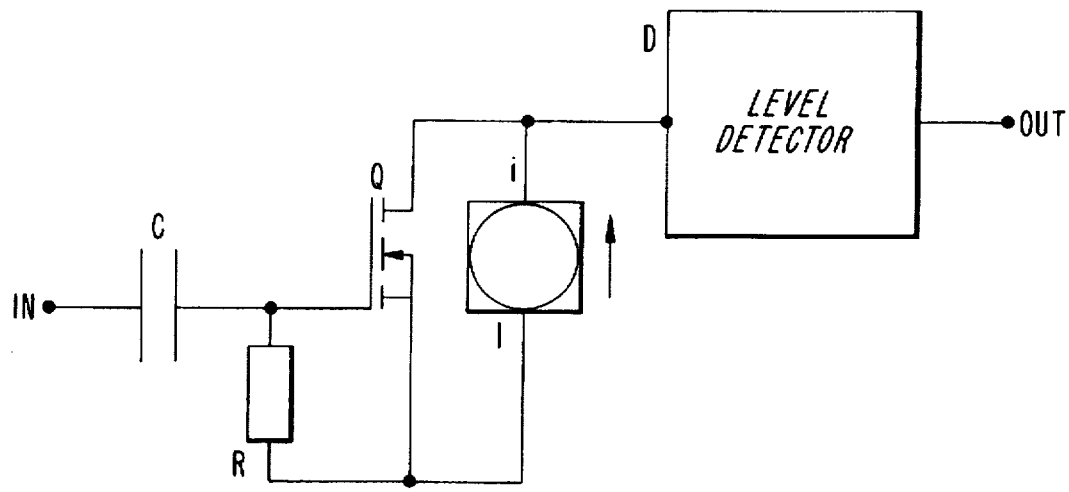
FIG. 1 is a circuit diagram showing the basic circuit principle according to the present invention.

FIG. 1 demonstrates a basic principle diagram of the new principle of detecting whether or not an incoming signal has a desired frequency. The basic diagram comprises an input capacitor C, a resistor R, a field effect transistor Q, a current generator I and a level detector D.

The signal $V_{IN}$ having the frequency to be detected is applied to the input IN. At the gate of the field effect transistor Q, there will be obtained a voltage spike for each rising edge of the signal $V_{IN}$. The amplitude of this voltage spike will be determined by the size of the input signal $V_{IN}$, which preferably should be larger than three times the threshold value, i.e., about 3 volts. The duration of the voltage spike is determined by the value of the capacitor C in combination with the value of the resistance R and the driving capability of the signal $V_{IN}$. The duration of the voltage spike determines for how long time the field effect transistor Q will be conducting and this time is denoted by t.

The channel resistance of the conducting field effect transistor is denoted $R_{ON}$. If no frequency is applied to the input IN in the circuit diagram of FIG. 1, the output impedance at the drain of the transistor Q remains infinitely high and the voltage of this node will rise due to that the current generator I is feeding current. If on the other hand $V_{IN}$ does have a frequency of the period time T, the transistor Q will conduct during the period t of each period of the input signal $V_{IN}$. The average resistance seen at the transistor Q drain then will be $R_{ON} \times T/t$. From this expression it is seen that the average resistance will vary with the frequency of the input signal $V_{IN}$. The higher the frequency, the lower the average resistance.

The average resistance multiplied by the current I give the voltage $V_K$ at the drain of the transistor Q. The level of this voltage is detected by the level detector D and as output signal OUT is obtained as a binary signal, i.e., a signal which either has the signal value 1 or the signal value 0. It is possible to detect the level in a variety of different manners according to prior art, for example, by means of an inverter or by means of a comparator and reference voltage. Dependent on the dimension design of the channel resistance, the current generator I and the capacitor C and the resistance R, different frequencies may be detected. Additionally, it is possible in series with the drain of the transistor Q to serially connect another resistor, the average resistance in the latter case becoming $(R_{ON}+R_{SERIES}) \times T/t$.

Thus, a frequency may be detected by the above principle by means of a capacitor, which may have a very small value, making it possible to integrate the design on a silicon chip. Another capacitor is further needed at the drain of the field effect transistor Q to obtain an abrupt reversal. This capacitor can also be integrated. The field effect transistor Q, as well as the resistor R, and the optional resistor $R_{SERIES}$ are simple to produce on a silicon chip by the same process method as according to standard technique in integrated circuits, while capacitors of large values are difficult to produce or will occupy inappropriate large silicon surface of the silicon chip.

Figure 2:
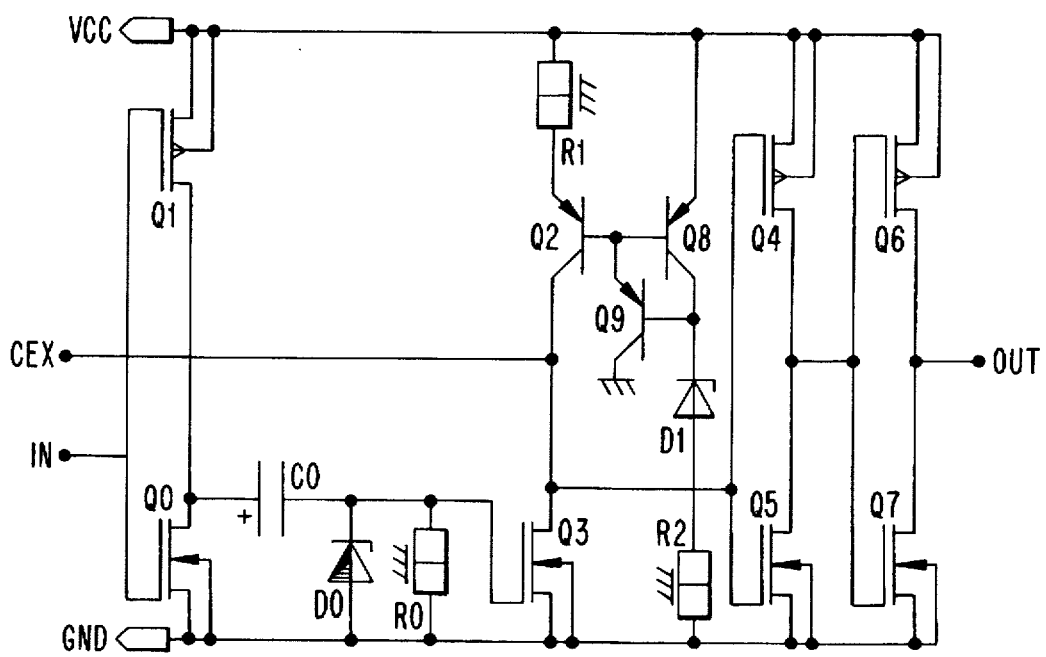
FIG. 2 is an example of a circuit diagram of a circuit design using the principle according to the present invention and being suitable for an integrated circuit.

FIG. 2 demonstrates a circuit block of a control circuit of a DC/DC converter in an illustrative embodiment suitable for integration on a small monolithic silicon chip according to the present invention. The circuit block of FIG. 2 determines the way the converter will be controlled. If the frequency is high enough the block switches to a steering by the signal obtained from the block (control by pulse width modulation), and if the frequency is too low, i.e., lower than a predetermined value, the block will be switching into another type of regulation.

The circuit block demonstrated in FIG. 2 comprises seven integrated field effect transistors Q0, Q1 and Q3–Q7, where Q3 corresponds to the transistor Q of FIG. 1. Furthermore, C0 corresponds to the capacitor C and R0 corresponds to the resistor R of FIG. 1. The circuit block includes another two diodes D0, D1, two resistors R1, R2 and three bipolar transistors Q2, Q8 and Q9. The circuit block has two inputs denoted IN and CEX and an output denoted OUT. The supply voltage is applied between the terminals GND and $V_{CC}$.

A capacitor is connected to the input CEX. It has the function of causing an abrupt reversal. Q0 and Q1 form a buffer such that the input IN will not be downloaded. At the input IN the signal, having the frequency to be detected, will be applied according to FIG. 1.

C0 and R0 together with $R_{ON}$ of Q1 generate a voltage pulse at the gate of the transistor Q3. Q3 will conduct for a certain voltage at its gate between about 1.5 volts and the supply voltage $V_{CC}$. The time during which the transistor Q3 will be conducting then is $$t=-C0 \times (R0+R_{ON(Q1)}) \times \ln[(V_{SS(Q3)}(R0+R_{ON(Q1)})/(V_{CC} \times R0)]$$

For the chosen component values C0=10 pF, R0=100 kΩ and $R_{ON(Q1)}$=10.5 kΩ at a supply voltage $V_{CC}$=11 volts, t=2.1 μs is obtained.

D0 is only a protection diode collecting negative substrate currents generated by the switching of C0. Q2, Q8, Q9, D1, R1 and R2 constitute a constant current generator. From the drain of the transistor Q2 a constant current of 1 μA is derived.

Transistors Q4 and Q5 form a symmetric inverter switching at $V_{CC}/2$ (in this case 5.5 volts). This voltage is denoted $V_{SWITCHING}$. Transistors Q6 and Q7 produce an output signal OUT to the remaining blocks in the monolithic circuit, 0=not valid frequency and 1=valid frequency.

The output impedance of the transistor Q3 at the drain is derived from the relationship of a field effect transistor structure $$R_{ON}=L/(\mu_n C_{ox} W(V_{GS}-V_T))$$

where L is the length of the transistor, W is the width of the transistor, $V_{GS}$ is the voltage between the control gate and the source electrode or the source, $V_T$ is the threshold voltage of the control gate, $\mu_n$ is the mobility in an N-channel structure and $C_{OX}$ is the capacitance of the capacitor formed by the field oxide.

As the time t is constituted by an RC constant $R_{ON}$ will change with the voltage of the control gate, the lower voltage on the control gate the larger $R_{ON}$. To in a simple way be able to get a measure of $R_{ON}$ it may be assumed that $R_{ON}$ is changing linearly with $V_{GS}$, whereby in this case the impedance of the transistor Q3 will become 2.56 kΩ.

The essence of the function according to the method of the present invention is that the output impedance of the transistor Q3 is changing with frequency. Thus the ON-time is constant but not the period time $$R_{ON(Q3)AVERAGE}=R'_{ON(Q3)} \times T/t.$$

If the drain current of Q2 is $I_{K(Q2)}$ the switching voltage will be $$V_{SWITCHING}=I_{K(Q2)} \times R_{ON(Q3)AVERAGE}=I_{K(Q2)} \times R'_{ON(Q3)} \times T/t$$

The frequency f=1/T will produce $$f=I_{K(Q2)} \times R'_{ON(Q3)}/V_{SWITCHING} \times t.$$

For instance for $I_{K(Q2)}$=1 μA, $R'_{ON(Q3)}$=2.56 kΩ, $V_{SWITCHING}$=5.5 V and t=2.1 μs, is derived f=222 Hz.

Such a low frequency would according to the prior art demand a rather large capacitor value to obtain an RC time constant corresponding to the frequency to be sensed and discriminated, and such a capacitor would be difficult to integrate, while a capacitor of the order 10 pF according to the present invention is simple to achieve as an integrated component according to normal processing methods in the production of integrated circuits.

It will be appreciated by those of ordinary skill in the art that the present invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

I claim:

1. A method for detecting whether or not a signal has a predetermined frequency, incorporating a capacitor, a resistor, a MOSFET and a current generator, comprising the steps of;

feeding a constant current to a drain electrode of said MOSFET;

generating voltage spikes having a period determined by said capacitor and said resistor into a gate electrode of said MOSFET, said period of said voltage spikes corresponding to the frequency to be detected;

modulating a channel resistance of a conducting channel of said MOSFET and thereby affecting the MOSFET's output impedance by the voltage signal at said gate electrode of said MOSFET when applying said constant current to said drain electrode of the MOSFET;

obtaining a voltage at said drain electrode of said MOSFET, said voltage being equal to an average value of said channel resistance of said conducting channel of said MOSFET multiplied by said constant current;

comparing the obtained voltage with a reference voltage, whereby a binary output signal is obtained as an indication whether the frequency is lower than a predetermined value due to the actual selection of component values.

2. The method according to claim 1, wherein said MOSFET comprises a high impedance gate electrode and a low drain current in a de-energized conduction channel, said current from said constant current generator only being fed through the conducting channel of said MOSFET during a portion of said period when a voltage spike on said gate electrode exceeds said predetermined value and wherein said reference voltage is set in a level detector connected to said drain electrode of the MOSFET.

3. The method according to claim 2, wherein said capacitor is constituted by a capacitance of less than 20 pF, which is integrated on a silicon chip, whereby a circuit design according to said method facilitates integration by conventional technique.

4. A frequency control device for determining whether a signal has a predetermined frequency, comprising:

generating means for generating voltage spikes having a period determined by a capacitor and a resistor into a gate electrode of a MOSFET, said period of the voltage spikes corresponding to the frequency to be detected;

feeding means for feeding a constant current to a drain electrode of the MOSFET, wherein said generating means and said feeding means operating to modulate a channel resistance of a conducting channel of the MOSFET and thereby affecting the MOSFET's output impedance by the voltage signal at said gate electrode of said MOSFET when applying the constant current to said drain electrode of the MOSFET;

detecting means for obtaining a voltage at said drain electrode of said MOSFET, said voltage being equal to the average value of said channel resistance of said conducting channel of said MOSFET multiplied by the constant current; and comparing means for comparing the obtained voltage with a reference voltage, whereby a binary output signal is obtained as an indication whether the frequency is lower than a predetermined value due to the actual selection of component values.

5. The frequency control device according to claim 4, further comprising an input connected to said capacitor for receiving an incoming voltage signal, wherein if said incoming voltage signal frequency is high enough said incoming voltage signal frequency is used for control, while if said incoming voltage signal frequency is too low said control device is switched to another type of regulation.

* * * * *